(12) United States Patent
Howell

(10) Patent No.: US 7,290,332 B1
(45) Date of Patent: Nov. 6, 2007

(54) METHOD OF CONSTRUCTING AN INTERPOSER

(75) Inventor: Robert P. Howell, San Jose, CA (US)

(73) Assignee: Exatron, Inc., San Jose, CA (US)

( * ) Notice: Subject to any disclaimer, the term of this patent is extended or adjusted under 35 U.S.C. 154(b) by 246 days.

(21) Appl. No.: 10/931,371

(22) Filed: Aug. 31, 2004

(51) Int. Cl.
*H01K 3/10* (2006.01)
(52) U.S. Cl. ............... 29/852; 29/831; 29/846; 427/97.1
(58) Field of Classification Search ............. 29/830, 29/831, 846, 852; 427/97.1
See application file for complete search history.

(56) References Cited

U.S. PATENT DOCUMENTS

| | | | | |
|---|---|---|---|---|
| 3,464,855 A | * | 9/1969 | Quintana et al. | 427/96.9 |
| 4,648,179 A | * | 3/1987 | Bhattacharyya et al. | 29/832 |
| 5,386,627 A | * | 2/1995 | Booth et al. | 29/852 |
| 5,744,758 A | * | 4/1998 | Takenouchi et al. | 174/255 |
| 5,950,306 A | * | 9/1999 | Suzuki et al. | 29/852 |
| 6,518,514 B2 | * | 2/2003 | Suzuki et al. | 174/262 |
| 6,691,409 B2 | * | 2/2004 | Suzuki et al. | 29/852 |
| 7,105,918 B2 | * | 9/2006 | Lee | 257/698 |

* cited by examiner

*Primary Examiner*—Carl J. Arbes
(74) *Attorney, Agent, or Firm*—Blakely, Sokoloff, Taylor & Zafman; Stephen M. De Klerk

(57) ABSTRACT

According to one aspect of the present invention, a method of constructing an interposer is provided. A conductive layer is formed on a nonconductive layer. The conductive layer has via portions, non-via portions, and first and second opposing surfaces. The first surface of the conductive layer is adjacent to the nonconductive layer. Portions of the nonconductive layer are removed to expose portions of the first surface of the conductive layer. Conductive pads are formed on the exposed portions of the first surface and the second surface of the conductive layer. The non-via portions of the conductive layer are removed to form a plurality of electrically separated conductors. Each conductor includes at least two conductive pads and a via portion of the conductive layer.

20 Claims, 11 Drawing Sheets

METHOD OF CONSTRUCTING AN INTERPOSER

BACKGROUND OF THE INVENTION

1). Field of the Invention

This invention relates to an interposer and a method of constructing an interposer.

2). Discussion of Related Art

Integrated circuits are formed on semiconductor wafers. The wafers are then sawed (or "singulated" or "diced") into microelectronic dies, also known as semiconductor chips, with each chip carrying a respective integrated circuit. Each semiconductor chip is then mounted to a package, or carrier, substrate, thereby forming a semiconductor package. Often the packages are temporarily connected to test sockets so that the integrated circuit can be tested before it is sold. The package is then mounted to a printed circuit board, which may then be installed into a computing system.

Additional substrates, called interposers, are often used to ensure the electrical connection between the test socket and the package, as well as between the printed circuit board and the package.

Such an interposer typically has a substrate with "via holes" therethrough and "vias" within the via holes to electrically connect the package to either the test socket or the printed circuit board. The process of manufacturing interposers is difficult and expensive because numerous steps are required to create the via holes and vias, as each via hole must be drilled through the substrate and the vias must be electroplated through the via holes. The via holes are very small, and thus, the drilling is very difficult and time consuming. Additionally, the accuracy of the drilling is very difficult to control when drilling the via holes at small pitches. Furthermore, the vias do not maximize the flow of electricity and heat as the vias are cylindrically shaped with a space extending therethough.

SUMMARY OF THE INVENTION

The invention provides a method of constructing an interposer including forming a conductive layer on a nonconductive layer, the conductive layer having via portions, non-via portions, and first and second opposing surfaces, the first surface being adjacent to the nonconductive layer, removing portions of the nonconductive layer to expose portions of the first surface of the conductive layer, forming conductive pads on the exposed portions of the first surface and the second surface of the conductive layer, and removing the non-via portions of the conductive layer to form a plurality electrically separated conductors, each conductor comprising at least two conductive pads and a via portion of the conductive layer.

The conductive pads on the second surface of the conductive layer may have first portions directly opposite the conductive pads on the first surface of the conductive layer and second portions directly opposite portions of the nonconductive layer.

The method may further include at least partially separating the portions of the nonconductive layer directly opposite the second portions of the conductive pads on the second surface of the conductive layer from the nonconductive layer.

The portions of the nonconductive layer directly opposite the second portions of the conductive pads on the second surface of the conductive layer may be flexibly attached to the nonconductive layer.

The conductive pads may include electrically conductive particles deposited on outer surfaces thereof.

The second portions of the conductive pads on the second surface of the conductive layer may extend away from the first portions of the conductive pads on the second surface of the conductive layer.

The exposed portions of the first surface of the conductive may be substantially circular.

The nonconductive layer may be polyimide and the conductive layer may be copper.

The conductive pads may further include nickel and the electrically conductive particles may include diamond.

The invention also provides a method of constructing an electronic assembly including constructing an interposer, said construction of the interposer including forming a conductive layer on a nonconductive layer, the conductive layer having via portions, non-via portions, and first and second opposing surfaces, the first surface being adjacent to the nonconductive layer, removing portions of the nonconductive layer to expose portions of the first surface of the conductive layer, forming first and second conductive pads on the exposed portions of the first surface and the second surface of the conductive layer, the via portions of the conductive layer interconnecting a respective first and second conductive pad, removing the non-via portions of the conductive layer to form a plurality electrically separated conductors, each conductor comprising at least two conductive pads and a via portion of the conductive layer, and connecting the first conductive pads to a first substrate, and connecting the second conductive pads to a second substrate.

At least one of the conductive pads on the second surface of the conductive layer may have first portions directly opposite the conductive pads on the first surface of the conductive layer and second portions directly opposite portions of the nonconductive layer.

The construction of the interposer may further include at least partially separating the portions of the nonconductive layer directly opposite the second portions of the conductive pads on the second surface of the conductive layer from the nonconductive layer and the portions of the nonconductive layer directly opposite the second portions of the conductive pads on the second surface of the conductive layer may be flexibly attached to the nonconductive layer.

The first substrate may be a printed circuit board and the second substrate may be a package substrate within an integrated circuit electrically connected thereto.

The first conductive pads may be formed on the first surface of the conductive layer and be directly connected to contact pads on the printed circuit board, and the second conductive pads may be formed on the second surface of the conductive layer and be directly connected to contact formations on the package substrate.

The method may further include securing the package substrate to the interposer and securing the interposer to the printed circuit board.

The invention further provides an electronic assembly including a first substrate having a plurality of contact pads on a surface thereof, a second substrate having a plurality of contact formations on a surface thereof, and an interposer interconnecting the first substrate and the second substrate, the interposer having a nonconductive substrate having a surface and a plurality of openings therethrough, conductive plates on portions of the nonconductive substrate being at least partially separated from the nonconductive substrate and over the openings through the nonconductive substrate, first conductive pads formed within the openings through the nonconductive substrate and adjacent to the conductive plates, and second conductive pads formed on the conductive plates, the first conductive pads being connected to the contact pads on the surface of the first substrate and the second conductive pads being connected to the contact formations on the surface of the second substrate.

The first substrate may be a printed circuit board and the second substrate may be a package substrate having an integrated circuit electrically connected thereto.

The first conductive pads may be secured to the contact pads on the surface of the printed circuit board and the second conductive pads may be secured to the contact formations on the surface of the package substrate.

BRIEF DESCRIPTION OF THE DRAWINGS

The invention is described by way of examples with reference to the accompanying drawings, wherein.

DETAILED DESCRIPTION OF THE INVENTION

FIG. 1 to FIG. 9 illustrate a method of constructing an interposer. A conductive layer is formed on a nonconductive layer. The conductive layer has via portions, non-via portions, and first and second opposing surfaces. The first surface of the conductive layer is adjacent to the nonconductive layer. Portions of the nonconductive layer are removed to expose portions of the first surface of the conductive layer. Conductive pads are formed on the exposed portions of the first surface and the second surface of the conductive layer. The non-via portions of the conductive layer are removed to form a plurality of electrically separated conductors. Each conductor includes at least two conductive pads and a via portion of the conductive layer.

Figure 1:
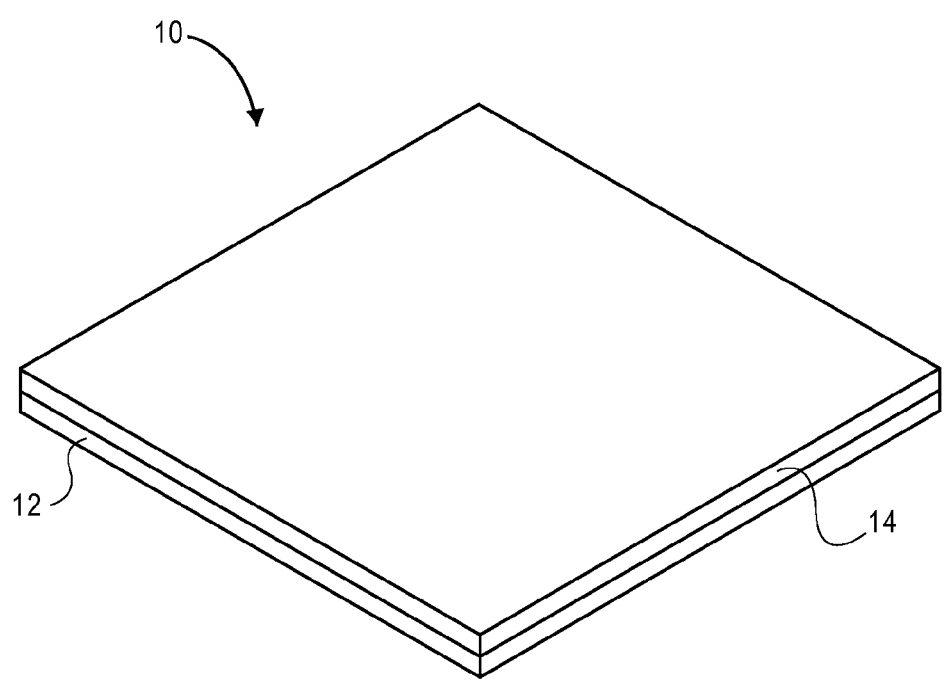
FIG. 1 is a perspective view of an interposer substrate including a nonconductive layer and a conductive layer.

FIG. 1 illustrates an interposer substrate 10 including a nonconductive layer 12 and a conductive layer 14. The nonconductive layer 12, or substrate, is made of flexible polyimide and has a thickness of approximately 0.0010 inch. The conductive layer 14 is made of copper foil formed directly on, or simply attached to, the nonconductive layer 12 and has a thickness of approximately 0.00070 inch. Referring to FIG. 2B, the conductive layer 14 has first 16 and second 18 opposing surfaces, the first 16 of which is adjacent to the nonconductive layer 12.

Figure 2A:
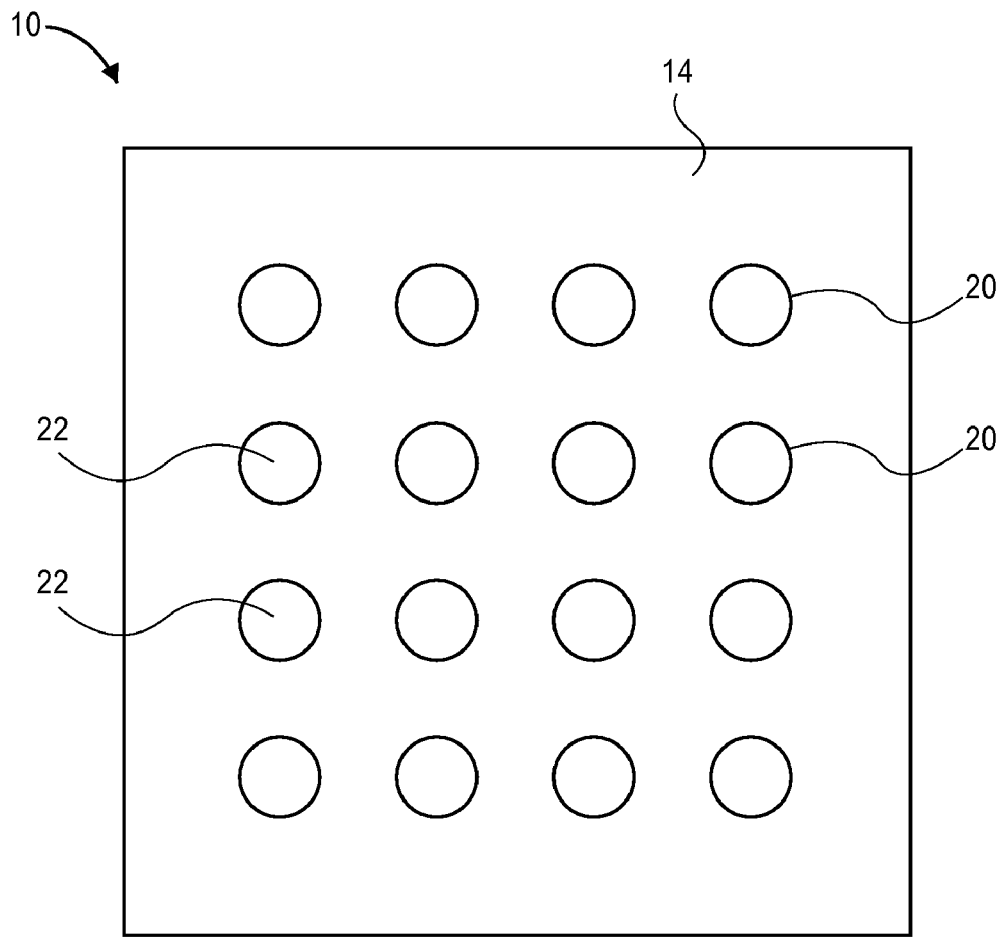
FIG. 2A is a top plan view of the interposer substrate after a plurality of openings have been formed in the nonconductive layer.
Figure 2B:
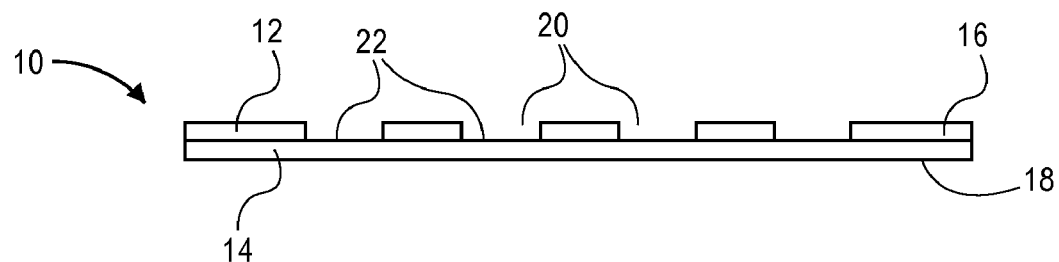
FIG. 2B is a cross-sectional side view of the interposer substrate as illustrated in FIG. 2A.

FIGS. 2A and 2B illustrate the interposer substrate 10 with the nonconductive layer 12 facing upwards. A plurality of openings 20 have been formed in the nonconductive layer 12. The openings 20 are formed at a central portion of the nonconductive layer 12 in a four by four array and are formed using conventional chemical etching techniques. The openings 20 are, in the example illustrated, circular in shape and extend completely through the nonconductive layer to expose portions 22 of the first surface 16 of the conductive layer 14.

Figure 3A:
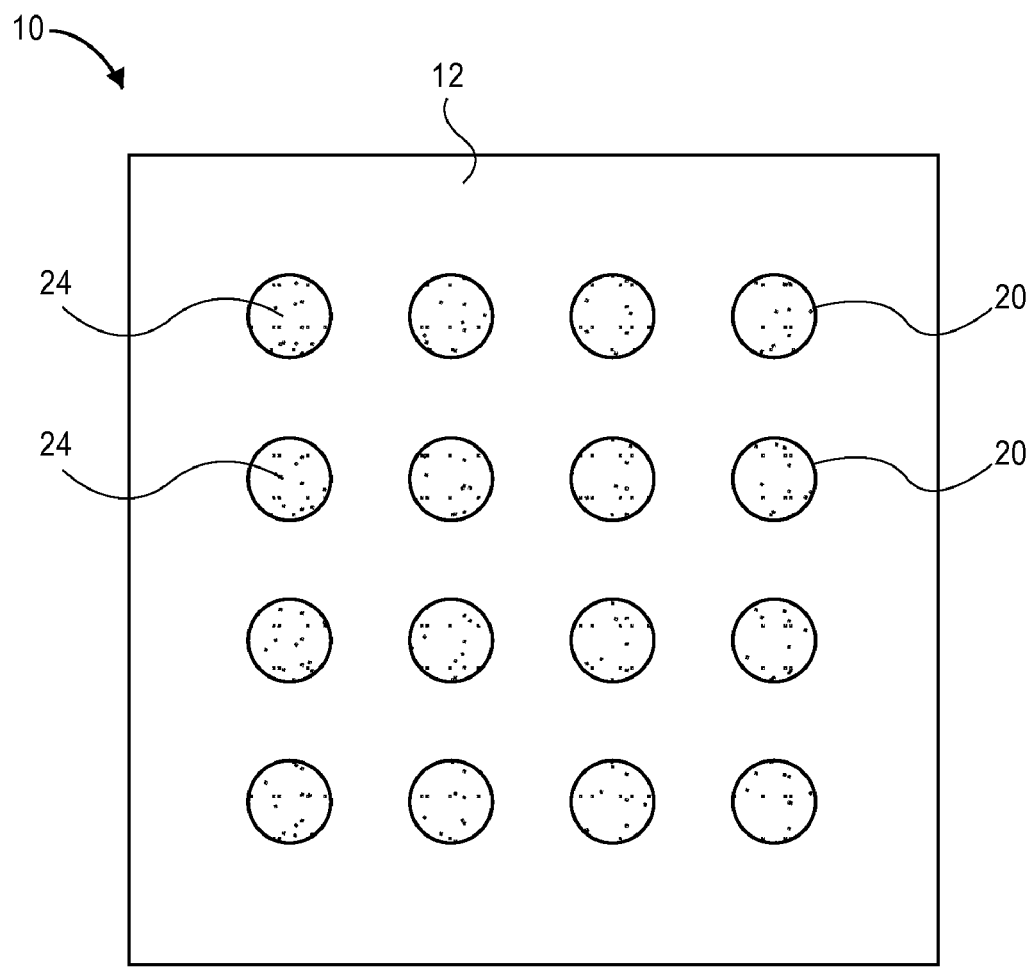
FIG. 3A is a top plan view of the interposer substrate with conductive pads formed within the openings in the nonconductive layer.
Figure 3B:
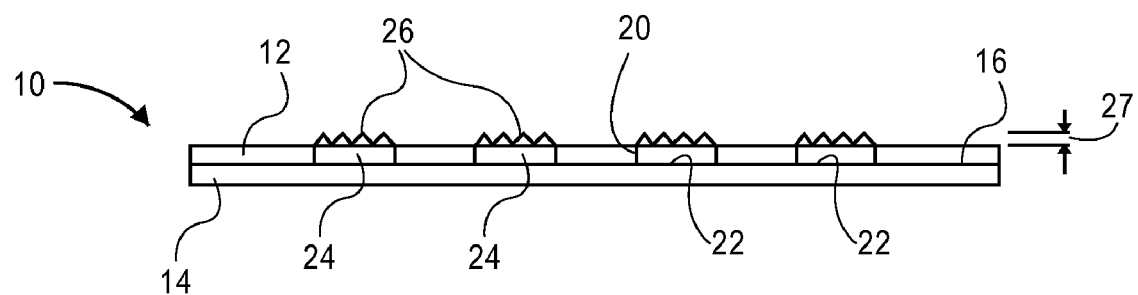
FIG. 3B is a cross-sectional side view of the interposer substrate as illustrated in FIG. 3A.

FIGS. 3A and 3B illustrate the interposer substrate 10 after a first set of conductive pads, or first conductive pads, 24 have been formed within the openings 20. The first conductive pads 24 are made of nickel and are formed using an electroplating technique. The first conductive pads completely fill the openings 20 and lie on the exposed portions 22 of the first surface 16 of the conductive layer 14. Similar to the openings 20, the first conductive pads 24 are circular and attached to the nonconductive layer 12 along a circumference thereof. Electrically conductive particles 26 have deposited on an outer surface of the first conductive pads 24 giving the first conductive pads 24 an effective height or thickness 27 greater than that of the thickness of the nonconductive layer 12. The electrically conductive particles 26 are in part made of diamond and are coated with a conductive material, such as a metal.

Figure 4A:
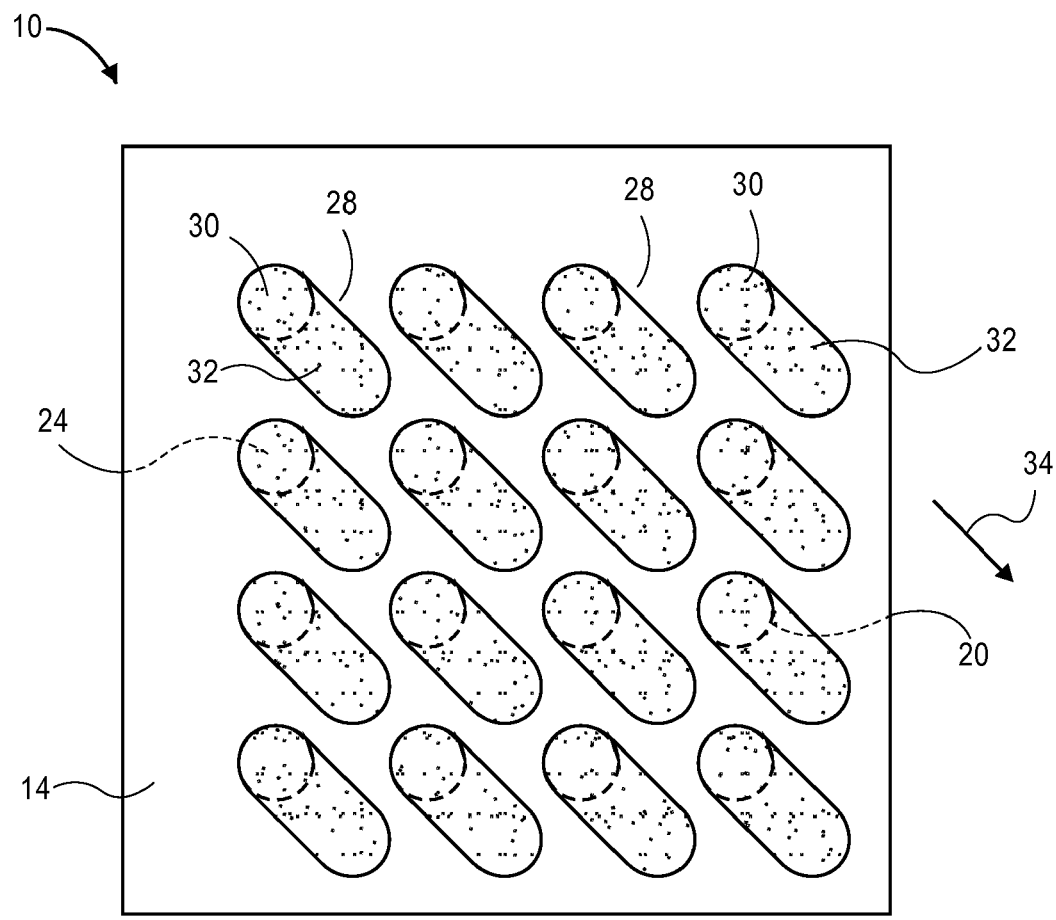
FIG. 4A is a top plan view of the interposer substrate after conductive pads have been formed on the conductive layer.
Figure 4B:
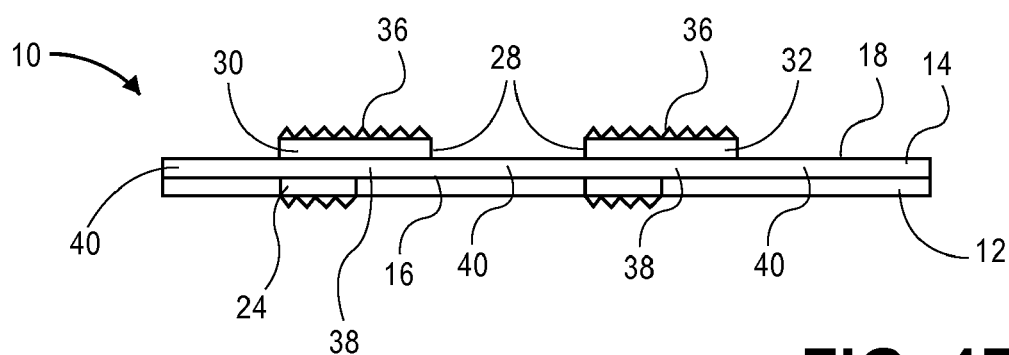
FIG. 4B is a cross-sectional side view of the interposer substrate as illustrated in FIG. 4A.

FIGS. 4A and 4B illustrate the interposer substrate 10 the conductive layer 14 facing upwards. A second set of conductive pads, or second conductive pads, 28 have been formed on the conductive layer 14. The second conductive pads 28, similar to the first conductive pads 24, are made of nickel and formed using an electroplating technique. The second conductive pads 28 have first portions 30 that are directly opposite the first conductive pads 24 on the first surface 16 of the conductive layer 14 and second portions 32 that are directly opposite portions of the nonconductive layer 12.

Referring specifically to FIG. 4A, the second conductive pads 28 are substantially rectangular in shape with rounded corners. The second portions 32 of the second conductive pads 28 all extend in substantially the same direction 34 away from the first portions 30 of the second conductive pads 28. The second conductive pads 28 have a width that is similar to a diameter of the openings 20 in the nonconductive layer 12.

Referring now to FIG. 4B, electrically conductive particles 36, similar to the electrically conductive particles 26 deposited on the first conductive pads 24, have been deposited onto the outer surface of the second conductive pads 28. The second conductive pads 28 divide the conductive layer 14 into via portions 38 and non-via portions 40. The via portions 38 lie directly beneath the second conductive pads 28, and the non-via portions 40 are not covered by the second conductive pads 28.

Figure 5A:
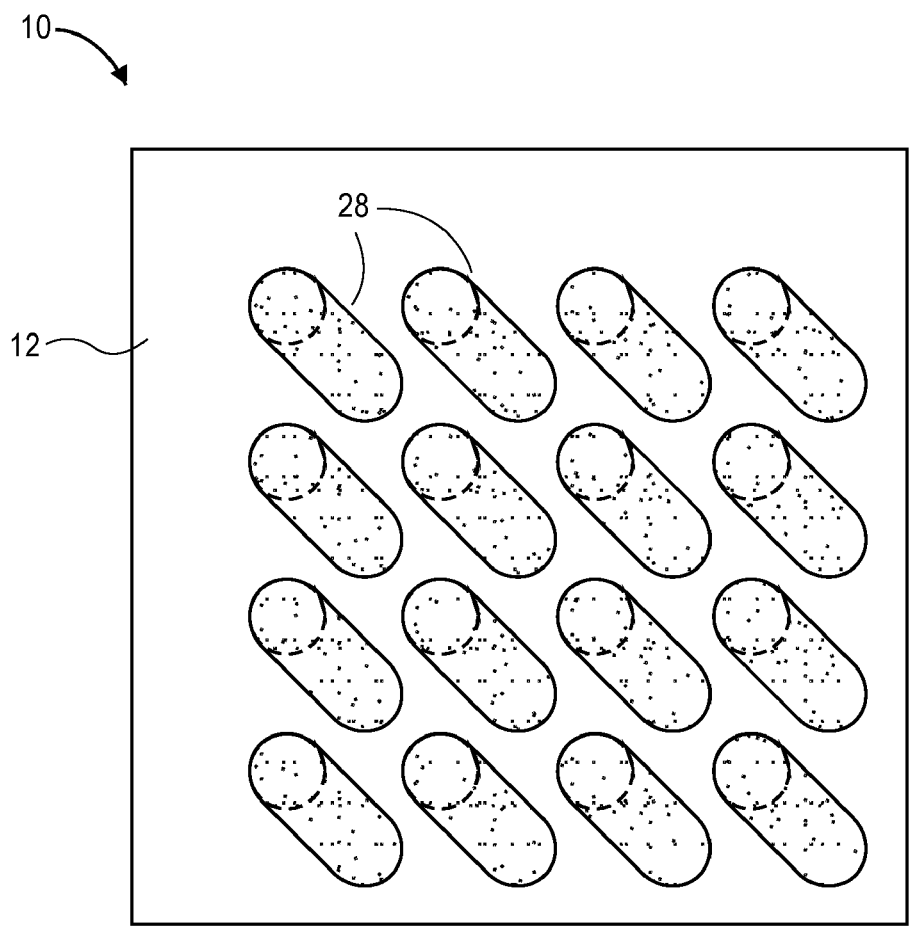
FIG. 5A is a top plan view of the interposer substrate after the conductive layer has been etched.
Figure 5B:
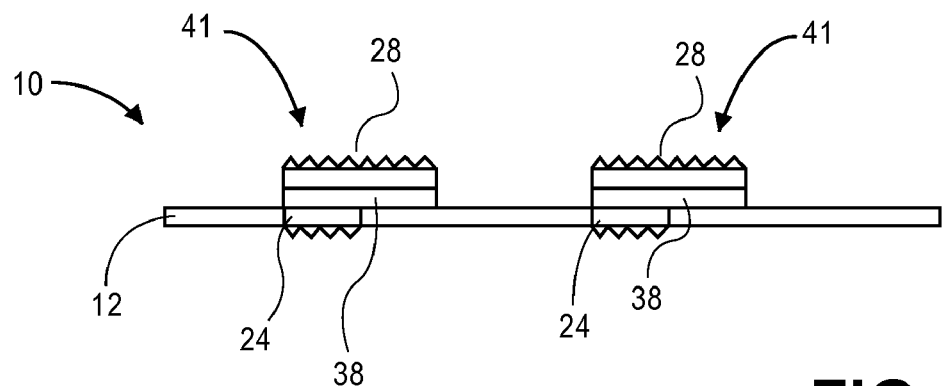
FIG. 5B is a cross-sectional side view of the interposer substrate as illustrated in FIG. 5A.

FIGS. 5A and 5B illustrate the interposer substrate 10 after the conductive layer 14 has been partially removed using conventional chemical etching techniques. The non-via portions 40 of the conductive layer 14 have been completely removed to separate the via portions 38 of the conductive layer 14 to form separate conductors 41. Each of the conductors 41 includes one of the first conductive pads 24, one of the second conductive pads 28, a via portion 38 of the conductive layer 14, and the thermally conductive particles 26 and 36 formed on the outer surfaces of the first 24 and second 28 conductive pads. Each of the conductors 41 is electrically separated from the other conductors 41. The conductors 41 remain attached to the nonconductive layer 12 through the via portions 38 of the conductive layer 14.

Figure 6A:
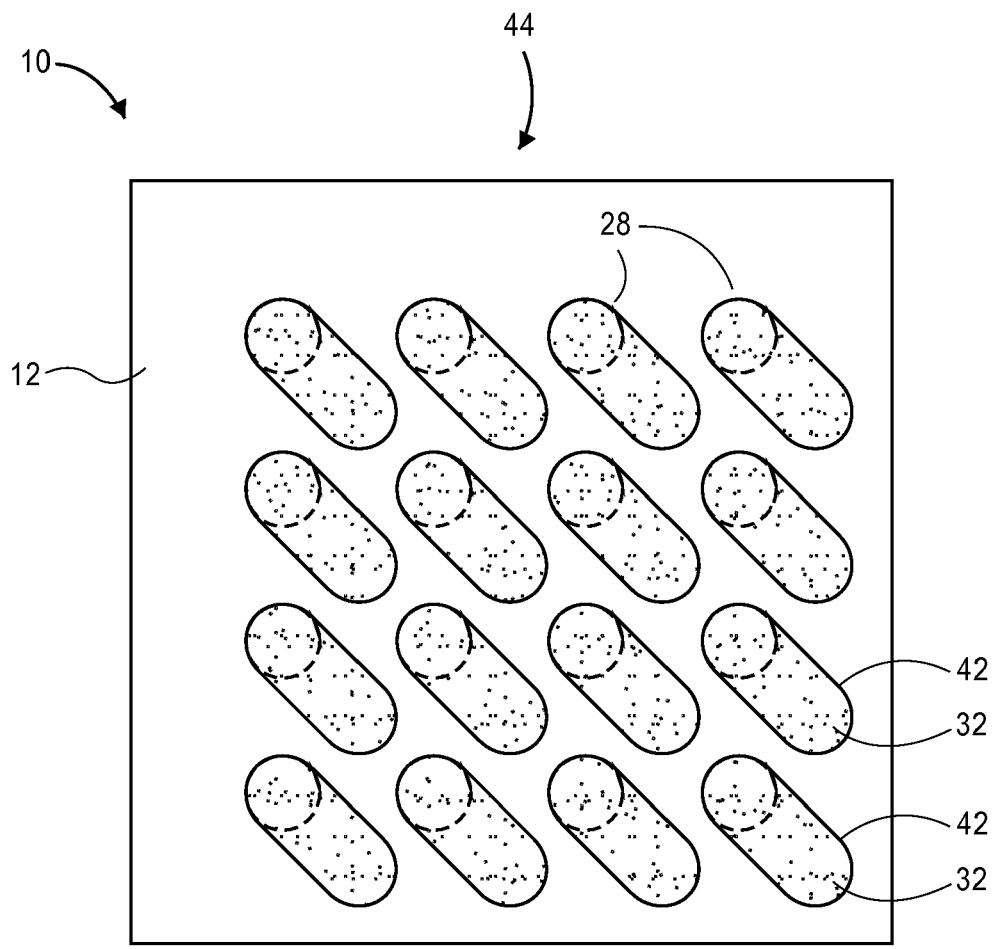
FIG. 6A is a top plan view of the interposer substrate after the nonconductive layer has been etched around the conductive pads on the conductive layer.
Figure 6B:
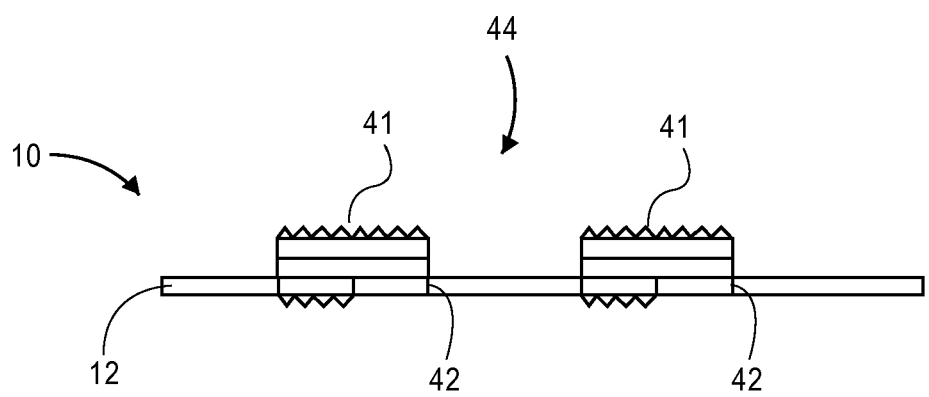
FIG. 6B is a cross-sectional side view of the interposer substrate as illustrated in FIG. 6A.
Figure 7A:
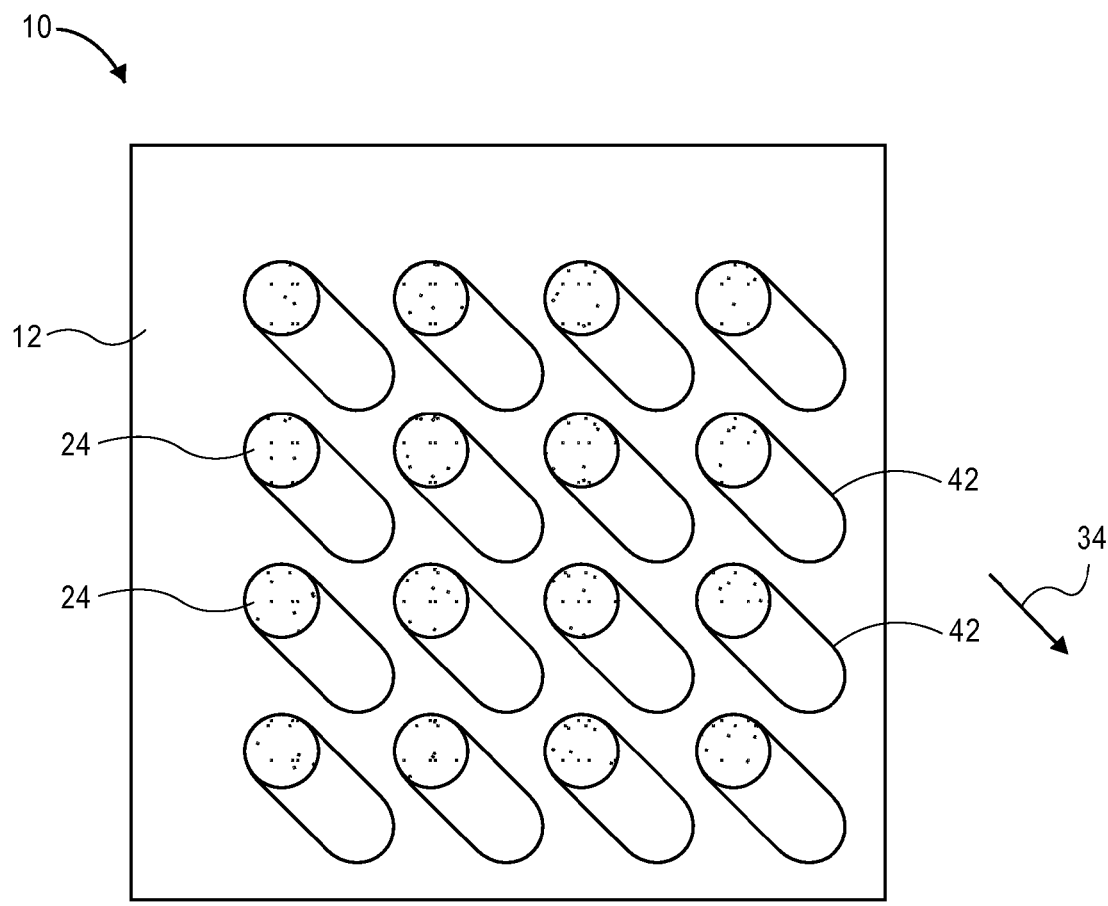
FIG. 7A is a bottom view of the interposer substrate as illustrated in FIG. 6A.
Figure 7B:
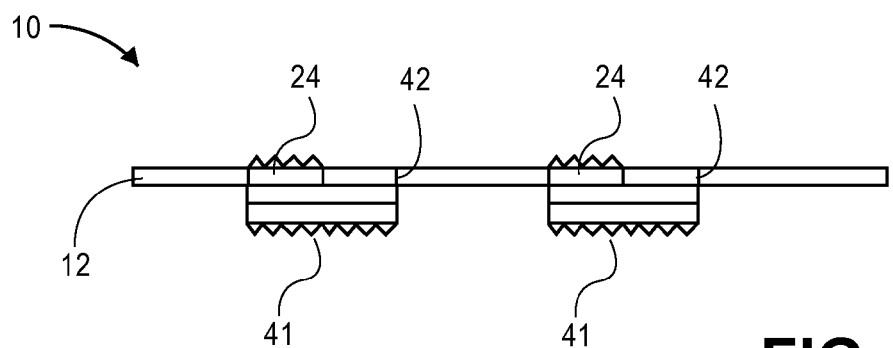
FIG. 7B is a cross-sectional side view of the interposer substrate as illustrated in FIG. 7A.

FIGS. 6A, 6B, 7A, and 7B illustrate the interposer substrate 10 after the conductors 41 have been partially separated from the interposer substrate 10. Referring specifically to FIG. 6A, the nonconductive layer 12 undergoes a laser and/or chemical etch immediately around the second portions 32 of the second conductive pads 28. The laser/chemical etching process produces separations, or gaps, 42 between the portions of the nonconductive layer 12 which are directly opposite the second portions 32 of the second conductive pads 28 and the remainder of the nonconductive layer 12. Referring now to FIG. 7A, the separations are "U-shaped" with an open end of the U facing opposite the direction 34. It should be noted that the separation 42 does not contact the first portion 30 of the second conductive pads 28 or the first conductive pads 24 so that the conductors 41 remain attached to, but are partially detached from, the interposer substrate 10.

FIGS. 6A, 6B, 7A, and 7B illustrate a completed interposer 44. The interposer 44 includes multiple conductors 41 that are interconnected by the nonconductive layer 12. Because of the flexible nature of the nonconductive layer 12 and the partial detachment of the conductors 41, each of the conductors 41 may flex or bend away from the interposer substrate 10 with a force applied a region of the conductors within the detached portions. The nonconductive layer 12 is resilient enough so that if the force is released, the conductors 41 will return to a neutral position as illustrated in FIGS. 6A and 7A.

Figure 8:
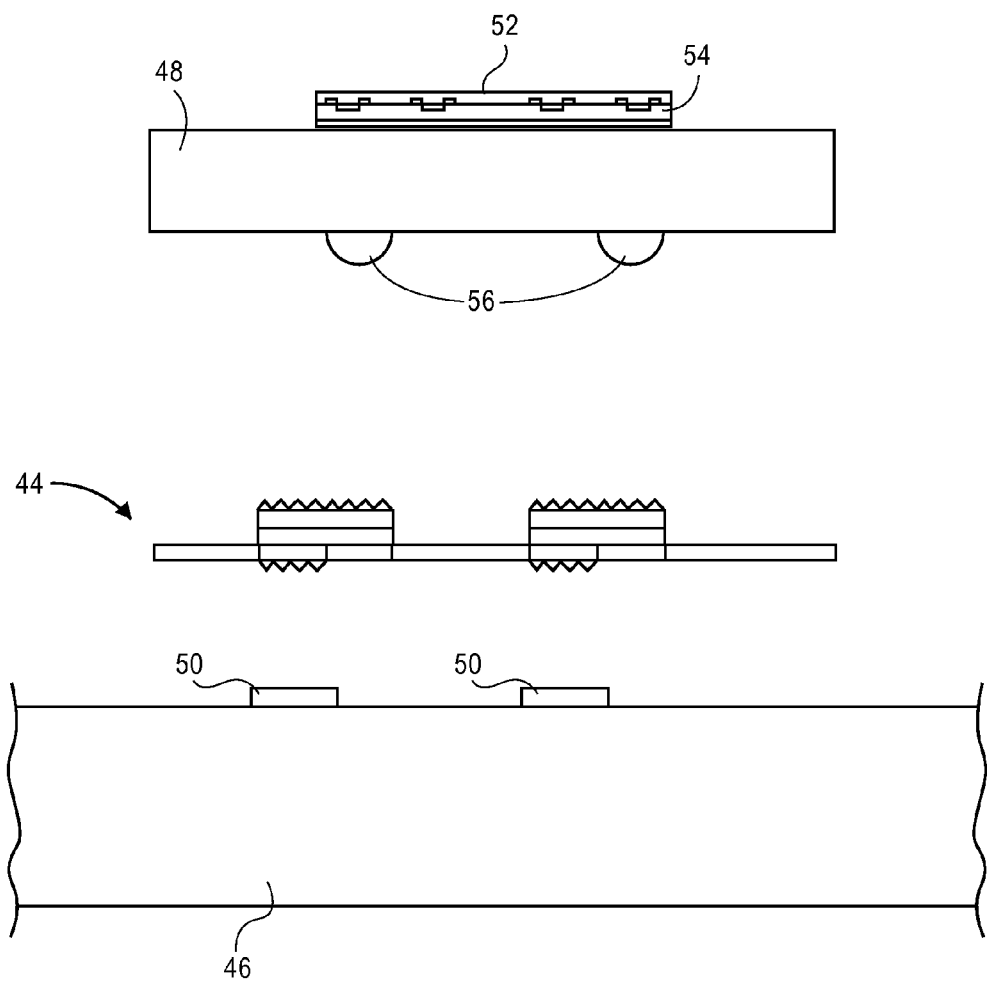
FIG. 8 is an exploded cross-sectional side view of an electronic assembly.
Figure 9:
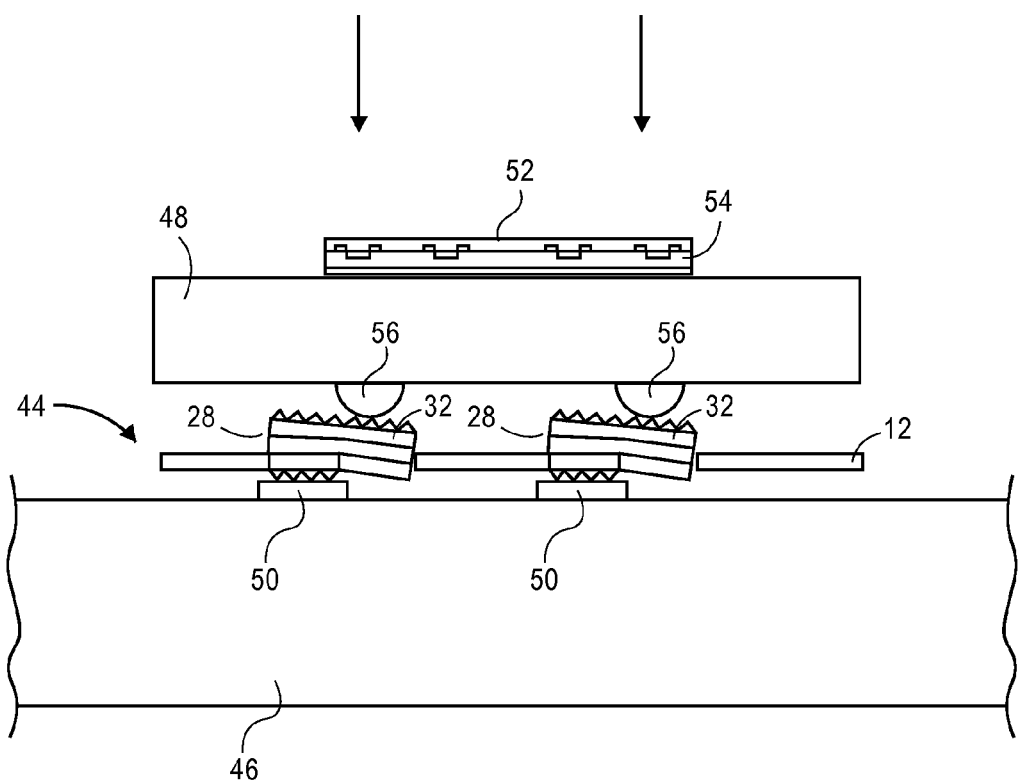
FIG. 9 is a cross-sectional side view of the electronic assembly illustrated in FIG. 8.

FIGS. 8 and 9 illustrate the construction of an electronic assembly including the interposer 44, a printed circuit board 46, and a package substrate 48. It should be noted that FIGS. 4B, 5B, 6B, 7B, 8, and 9 show, for the sake of clarity, two of the conductors 41.

The printed circuit board 46 includes a plurality of solder contact pads 50 on an upper surface thereof. The package substrate 48 includes a microelectronic die 52, having an integrated circuit 54 formed therein, mounted to a top surface thereof and a plurality of solder contact formations 56, such as Ball Grid Array (BGA) solder balls, attached to a bottom surface thereof. Although the package substrate 48, as illustrated, only includes two contact formations 56, it should be understood that in actually there may be literally dozens, or thousands of the contact formations 56. One example of a package substrate may include as many as two thousand contact formations 56.

Referring specifically to FIG. 9, the first conductive pads 24 of the interposer 44 are connected to the contact pads 50 of the printed circuit board 46. The contact formations 56 on the package substrate 48 are connected to the second portions 32 of the second conductive pads 28. When a downward force is applied to the package substrate 48 toward the printed circuit board, the portions the nonconductive layer 12 of the interposer 44 that are connected to the second portions 32 of the second conductive pads 28, and that have been separated, flex toward the printed circuit board 46. The conductors 41 remain connected to the interposer because the separation 42 has only released the portions of the nonconductive layer 12 that are beneath the second portions 32 of the second conductive pads. The force necessary to cause the conductors 41 to flex is a spring force: $F=-k\Delta x$, where $\Delta x$ is the distance the conductor has been displaced and k is a spring constant based on the stiffness of the nonconductive layer.

If any of the contact formations 56 on the package substrate 48 are of a different size or shape compared to the other contact formations 56, or any of the components illustrated in FIG. 9 are misshaped or warped, the combination of the downward force applied to the package substrate 48 and the flexibility of the conductors 41 relative the rest of the interposer ensures that each of the contact formations 56 soundly contacts on of the conductors 41.

In use, the printed circuit board 46 is installed in a computing system. Electric signals such as input/output (10) signals, are then sent from the integrated circuit 54 within the die 52 through the package substrate 48, the conductors 41, the printed circuit board 46 via the contact pads 50, and into the computing system. The computing system may send similar, or different, signals back to the integrated circuit 54 within the die 52 through the printed circuit board 46, the conductors 41, and the package substrate 48.

If the assembly experiences and additional stress, such as by heating and/or cooling, or vibration, such as by the computing system being dropped, the conductors 41 absorb some of the impact and help ensure that the electrical connection between the integrated circuit 54 and the printed circuit board 46 is maintained.

From the above discussion, it will be evident that the formation of the vias within the interposer is facilitated because via openings do not have to be drilled through the interposer and that the vias do not have to be electroplated through the interposer. An easier, less expensive method of constructing an interposer is thus provided. It will also be noted that the interposer substrate from which the interposer is formed only needs to have the conductive material on one side thereof. Thus, the cost of manufacturing the interposer is even further reduced. Furthermore, because of the flexible nature of the nonconductive layer, and/or the conductors, and the separation between the portions of the nonconductive layer and the remainder of the nonconductive layer, a more reliable connection is made between the contact formations on the package substrate and the conductive pads on the interposer. Because of the flexibility of the conductors, the detrimental affect of any imperfections in the contact formations on the package substrate is minimized. A further advantage is that the conductors do not include any spaces therein thereby maximizing the thermal and electrical conductivity of the conductors.

Figure 10A:
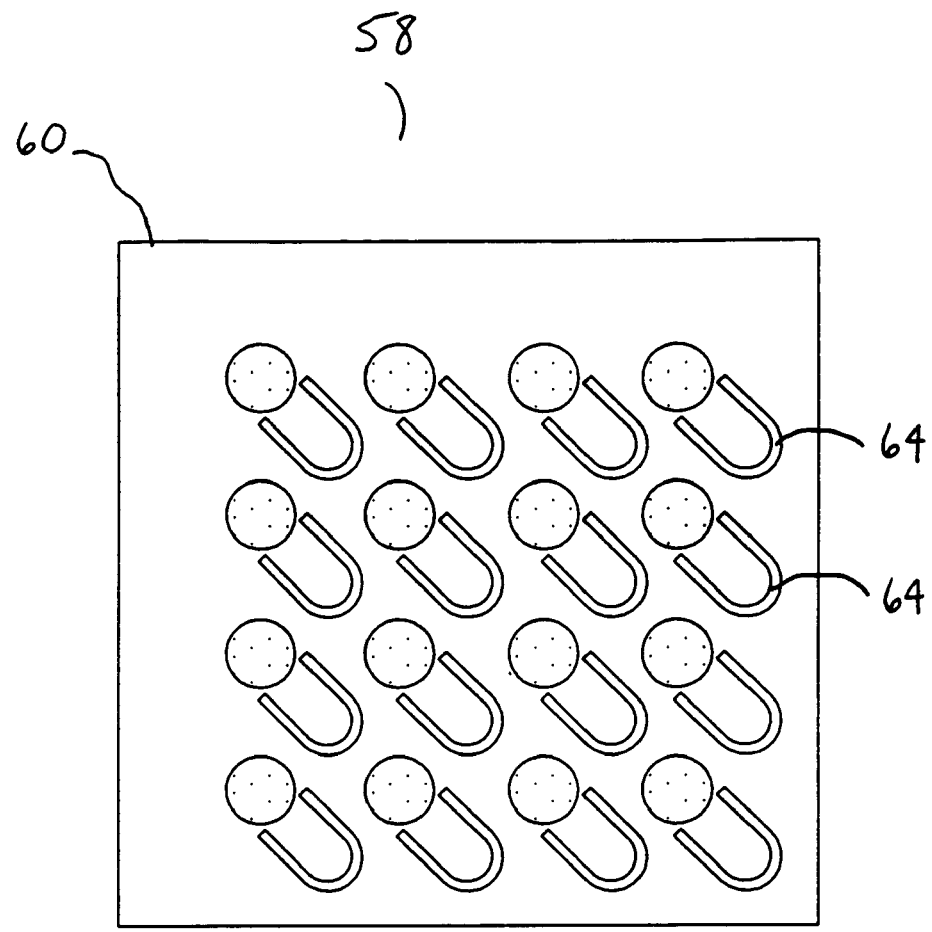
FIG. 10A is a is a top plan view of an interposer substrate according to alternative embodiment of the invention after the nonconductive layer has been etched around the conductive pads on the conductive layer.
Figure 10B:
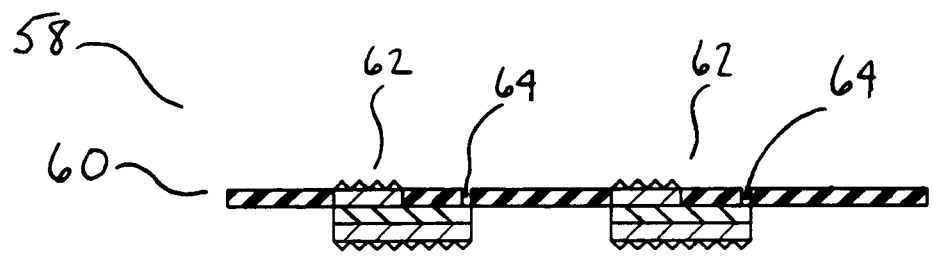
FIG. 10B is a cross-sectional side view of the interposer substrate as illustrated in FIG. 10A.

FIGS. 10A, 10B, 11A, and 11B illustrate alternative embodiments of the interposer. FIGS. 10A and 10B illustrate an interposer 58, similar to the interposer 44 illustrated in FIGS. 7A and 7B, which includes an interposer substrate 60 and conductors 62. The conductors 62 have been partially separated from the interposer substrate 60, creating separations 64. The separations 64 are similar to the separations 42 illustrated in FIG. 7A, however, the separations 64 have a greater width.

Figure 11A:
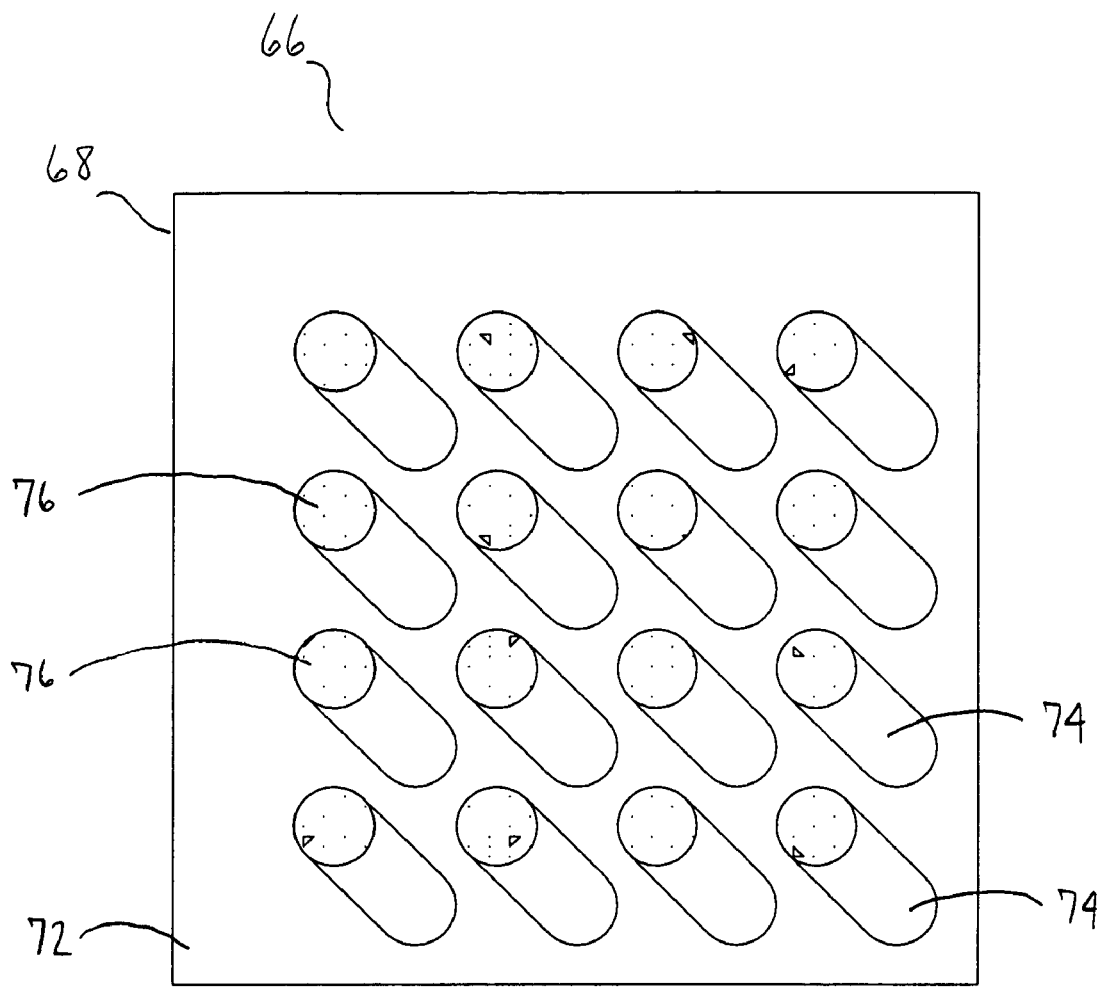
FIG. 11A is a is a top plan view of an interposer substrate according to alternative embodiment of the invention after the nonconductive layer has been etched around the conductive pads on the conductive layer.
Figure 11B:
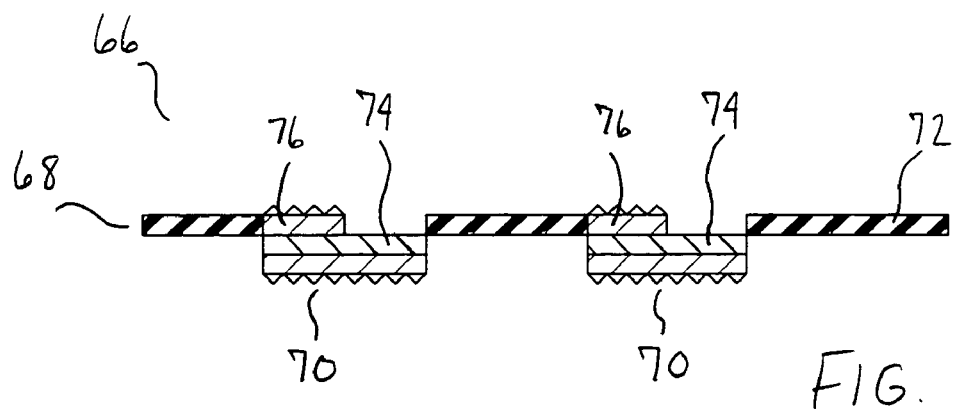
FIG. 11B is a cross-sectional side view of the interposer substrate as illustrated in FIG. 11A.

FIGS. 11A and 11B illustrate an interposer 66 according to another embodiment of the invention. The interposer 66 includes an interposer substrate 68 and conductors 70 that have been partially separated from the interposer substrate 68. The interposer substrate 68 includes a nonconductive layer 72 and via portions 74 of a conductive layer. As illustrated, the portions of the nonconductive layer 72 adjacent to the via portions 74 have been completely removed to partially separate the conductors 70 from the interposer substrate 68. The conductors 70 remain partially connected to the interposer substrate because each conductor 70 has a conductive pad 76 that is connected to the nonconductive layer 72.

Other embodiments may use the interposer to connect the package substrate, or other electronic devices, to a test socket, which may also be a printed circuit board, so that the electronic device may be tested before it is sold. In such an embodiment, the electrical device would not be permanently secured to the interposer, and the interposer may not be permanently secured to the printed circuit board. Once connected to the test socket, electronic signals are sent to and from the integrated circuit to ensure that is functioning properly.

Other etching techniques may be used during the various steps of the formation of the interposer, such as chemical, plasma, or laser etching, as is commonly understood in the art. Other conductive materials may be used for the conductive layer, such as aluminum. Other materials may be used for the nonconductive layer, such as FR-4, Kapton, and other similar printed circuit board materials. The conductors may formed on the interposer substrate in different arrays. All of the various components of the interposer may be formed to different sizes and shapes, as is commonly understood in the art.

While certain exemplary embodiments have been described and shown in the accompanying drawing is to be understood that such embodiments are merely illustrative and not restrictive of the current invention, and that this invention is not restricted to the specific constructions and arrangements shown and described since modifications may occur to those ordinarily skilled in the art.

What is claimed is:

1. A method of constructing an interposer comprising:
    forming a conductive layer on a nonconductive layer, the conductive layer having via portions, non-via portions, and first and second opposing surfaces, the first surface being adjacent to the nonconductive layer;
    removing portions of the nonconductive layer to expose portions of the first surface of the conductive layer;
    forming conductive pads on the exposed portions of the first surface and the second surface of the conductive layer;
    removing the non-via portions of the conductive layer to form a plurality electrically separated conductors, each conductor comprising at least two conductive pads and a via portion of the conductive layer,
    at least partially separating the portions of the nonconductive layer directly opposite the second portions of the conductive pads on the second surface of the conductive layer from the nonconductive layer,
    wherein the conductive pads on the second surface of the conductive layer have first portions directly opposite the conductive pads on the first surface of the conductive layer and second portions directly opposite portions of the nonconductive layer,
    wherein the portions of the nonconductive layer directly opposite the second portions of the conductive pads on the second surface of the conductive layer are flexibly attached to the nonconductive layer.

2. The method of claim 1, wherein the conductive pads comprise thermally conductive particles deposited on outer surfaces thereof.

3. The method of claim 2, wherein the second portions of the conductive pads on the second surface of the conductive layer extend away from the first portions of the conductive pads on the second surface of the conductive layer.

4. The method of claim 3, wherein the exposed portions of the first surface of the conductive are substantially circular.

5. The method of claim 4, wherein the nonconductive layer is polyimide.

6. The method of claim 5, wherein the conductive layer is copper.

7. The method of claim 6, wherein the conductive pads further comprise nickel and the thermally conductive particles comprise diamond.

8. The method of claim 1, wherein removing portions of the nonconductive layer comprises etching the nonconductive layer.

9. The method of claim 1, further comprising removing portions of the nonconductive layer to produce separations in the nonconductive layer.

10. The method of claim 9, wherein removing portions of the nonconductive layer comprises etching the nonconductive layer.

11. The method of claim 9, wherein the separations are U-shaped.

12. A method of constructing an electronic assembly comprising:
    constructing an interposer, said construction of the interposer comprising:
        forming a conductive layer on a nonconductive layer, the conductive layer having via portions, non-via portions, and first and second opposing surfaces, the first surface being adjacent to the nonconductive layer;
        removing portions of the nonconductive layer to expose portions of the first surface of the conductive layer;
        forming first and second conductive pads on the exposed portions of the first surface and the second surface of the conductive layer, the via portions of the conductive layer interconnecting a respective first and second conductive pad;
        removing the non-via portions of the conductive layer to form a plurality electrically separated conductors, each conductor comprising at least two conductive pads and a via portion of the conductive layer;
    connecting the first conductive pads to a first substrate;
    connecting the second conductive pads to a second substrate;

at least partially separating the portions of the nonconductive layer directly opposite the second portions of the conductive pads on the second surface of the conductive layer from the nonconductive layer and wherein the portions of the nonconductive layer directly opposite the second portions of the conductive pads on the second surface of the conductive layer are flexibly attached to the nonconductive layer wherein at least one of the conductive pads on the second surface of the conductive layer have first portions directly opposite the conductive pads on the first surface of the conductive layer and second portions directly opposite portions of the nonconductive layer.

13. The method of claim 12 wherein the first substrate is a printed circuit board.

14. The method of claim 13, wherein the second substrate is a package substrate within an integrated circuit electrically connected thereto.

15. The method of claim 14, wherein the first conductive pads are formed on the first surface of the conductive layer and are directly connected to contact pads on the printed circuit board and the second conductive pads are formed on the second surface of the conductive layer and are directly connected to contact formations on the package substrate.

16. The method of claim 15, further comprising securing the package substrate to the interposer and securing the interposer to the printed circuit board.

17. The method of claim 12, further comprising removing portions of the nonconductive layer to produce separations in the nonconductive layer.

18. The method of claim 17, wherein the separations are U-shaped.

19. The method of claim 12, wherein removing portions of the nonconductive layer comprises etching the nonconductive layer.

20. The method of claim 17, wherein removing portions of the nonconductive layer comprises etching the nonconductive layer.

* * * * *

UNITED STATES PATENT AND TRADEMARK OFFICE
CERTIFICATE OF CORRECTION

| | | |
|---|---|---|
| PATENT NO. | : 7,290,332 B1 | Page 1 of 1 |
| APPLICATION NO. | : 10/931371 | |
| DATED | : November 6, 2007 | |
| INVENTOR(S) | : Robert P. Howell | |

It is certified that error appears in the above-identified patent and that said Letters Patent is hereby corrected as shown below:

Col. 8, in Claim 1, after line 14, insert --wherein the conductive pads on the second surface of the conductive layer have first portions directly opposite the conductive pads on the first surface of the conductive layer and second portions directly opposite portions of the nonconductive layer,--.

Col. 8, in Claim 1, at line 19, delete "wherein the conductive pads on the second surface of the conductive layer have first portions directly opposite the conductive pads on the first surface of the conductive layer and second portions directly opposite portions of the nonconductive layer,".

Signed and Sealed this
First Day of February, 2011

David J. Kappos
*Director of the United States Patent and Trademark Office*